US 10,823,762 B2

(12) United States Patent
Zhang et al.

(10) Patent No.: US 10,823,762 B2
(45) Date of Patent: Nov. 3, 2020

(54) METHOD AND APPARATUS FOR AUTOMATICALLY ADJUSTING THE HOLD-OFF TIME OF A DSO

(71) Applicant: UNIVERSITY OF ELECTRONIC SCIENCE AND TECHNOLOGY OF CHINA, Chengdu, Sichuan (CN)

(72) Inventors: Qinchuan Zhang, Chengdu (CN); Feng Tan, Chengdu (CN); Huiqing Pan, Chengdu (CN); Hao Zeng, Chengdu (CN); Luonan Zheng, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 238 days.

(21) Appl. No.: 16/005,763

(22) Filed: Jun. 12, 2018

(65) Prior Publication Data

US 2018/0364282 A1 Dec. 20, 2018

(30) Foreign Application Priority Data

Jun. 14, 2017 (CN) .......................... 2017 1 0446140

(51) Int. Cl.
*G01R 13/02* (2006.01)
(52) U.S. Cl.
CPC ................ *G01R 13/0254* (2013.01)
(58) Field of Classification Search
CPC .............. G01R 13/0254; H04W 72/12; H04W 74/0816; H04W 76/40
See application file for complete search history.

(56) References Cited

U.S. PATENT DOCUMENTS

| 5,223,784 A | 6/1993 | Nelson et al. |
| 6,621,913 B1 | 9/2003 | de Vries |
| 7,072,804 B2 | 7/2006 | Weller |
| 7,723,976 B2 | 5/2010 | Sullivan et al. |
| 9,506,951 B2 * | 11/2016 | Taratorin ............. G01R 13/029 |
| 2004/0117138 A1 * | 6/2004 | Tran ....................... G01R 13/02 702/66 |
| 2012/0001657 A1 * | 1/2012 | Sullivan ............. G01R 13/0254 327/90 |

FOREIGN PATENT DOCUMENTS

EP          2402768 A2      1/2012

* cited by examiner

*Primary Examiner* — Elias Desta
(74) *Attorney, Agent, or Firm* — Oliff PLC

(57) ABSTRACT

The present invention provides a method and apparatus for automatically adjusting the hold-off time of a DSO based on real-time cycle measurements of the system trigger signal: obtaining a cycle sequence by measuring the system trigger signal, the maximum cycle and minimum cycle, then judging the difference of the maximum cycle and minimum cycle: if the difference is greater than a threshold set by user, setting the hold-off time to the maximum cycle, the minimum cycle or the median cycle, then returning; otherwise terminating the adjustment of the hold-off time. At this point, the hold-off time is correctly set. Therefore, the present invention reduces the complexity and time consumption of the hold-off adjustment, and allows the test signal to be quickly and stably displayed on screen of DSO, meanwhile, which makes the trigger adjustment of DSO more convenient.

3 Claims, 2 Drawing Sheets

(a)  (b)

US 10,823,762 B2

METHOD AND APPARATUS FOR AUTOMATICALLY ADJUSTING THE HOLD-OFF TIME OF A DSO

FIELD OF THE INVENTION

This application claims priority under the Paris Convention to Chinese Patent Application No. 201710446140.5, filed on Jun. 14, 2017, the entirety of which is hereby incorporated by reference for all purposes as if fully set forth herein.

The present invention relates to the field of digital storage oscilloscope (DSO), more particularly to a method and apparatus for automatically adjusting the hold-off time of a DSO.

BACKGROUND OF THE INVENTION

In order to get a stable waveform display on the screen, a DSO (Digital Storage Oscilloscope) will be required to be set with correct parameters, such as trigger condition, vertical level, time base and so on, according to the characteristics of a test signal. However, a complex signal may have a plurality of identical characteristics in one cycle, when the complex signal is acquired, each characteristic may become a trigger point, which leads to unstable waveform display on the screen. As shown in FIG. 1, the test signal has three rising edges in one cycle (as shown in FIG. 1 (a)), and each rising edge may be used to trigger the DSO, which leads to unstable waveform display (as shown in FIG. 1 (b)).

U.S. Pat. No. 5,223,784, issued to Diller, et al. on Jun. 29, 1993, discloses an analog circuit for triggering an acquisition system only once during a period of an input signal having multiple triggering events during that period. A triggering event is qualified by a first trigger comparator using a first reference trigger level, then a capacitor is charged. A second trigger comparator compares the voltage on the capacitor with a second reference trigger level, and produces a pulse if the capacitor voltage has a predetermined relationship to the second reference trigger level. Subsequent trigger events which occur before a predetermined period of time, determined by an RC time constant, are unable to produce another trigger event.

U.S. Pat. No. 6,621,913, issued to Johan deVries on Sep. 16, 2003, discloses a complex method to make a stable display by blocking some triggers. Valid trigger in DSO may be recognized from triggering level, time interval and signal amplitude information, as well as other pattern-related information, to control waveform acquisition. In this method, the expected trigger interval information must be known or derived from the previous measurement to generate a valid trigger when a signal has a repetition rate that matches.

U.S. Pat. No. 7,072,804, issued to Dennis J. Weller on Jul. 4, 2006, discloses a digital trigger circuit having two input IIR (Infinite Impulse Response) filters for performing high and low frequency rejection, AC and DC triggering.

U.S. Pat. No. 7,723,976, issued to Sullivan et al. on May 25, 2010, discloses a circuit that measures the time between trigger events and computes an approximation of an average or peak time between trigger events to avoid triggering on "false" edge triggers caused by not enough hysteresis (or no hysteresis).

European Patent Application No. 2,402,768, filed by Sullivan et al. on Jan. 4, 2012, discloses an improved edge triggering circuit for selecting certain trigger events based on a characteristic of the signal that indicates a repetitive nature of a complex signal. For example, the trigger qualifier circuit tries to detect the longest (shortest) period interval, which is a characteristic that happens only once in each repetition, and only when the time between trigger events is longer (shorter) than ⅞ (1.25) times the longest (shortest) time between edges will the edge trigger event become a trigger that may be used to trigger the oscilloscope. Therefore, if the longest and shortest period interval of the signal are not unique, i.e. there are multiple longest and shortest period interval in each repetition, it fails to provide a stable display.

The above-discussed patents and patent publication are either an analog trigger circuit implementation, or a digital filter, or a method that selects qualifying trigger events based on the characteristic of the signal. Also these patents do not consider automatically adjusting the hold-off time.

In prior art, a trigger hold-off circuit is introduced to DSO to try to solve the unstable waveform display: after a trigger happens, a timer in the trigger hold-off circuit will be started to hold off the triggering, until the timer expires. The triggering during the hold-off time does not work, even if the test signal meets the trigger condition. The setting of hold-off time is helpful for the acquisition of transient signal with multiple edges, it can make the unstable waveform displayed on screen clear, i.e. stable. But if the hold-off time is set incorrectly, the signals acquired at different trigger points will be superposed together by DSO, leading an unstable waveform display.

However, the setting of hold-off time, i.e. adjusting the hold-off time of a DSO is performed by user, which leads to increase of measurement time. And even more, under some circumstance, the user needs to roughly know the time-domain characteristics of the test signal in advance. Therefore, manually adjusting the hold-off time of a DSO is complex and slow.

SUMMARY OF THE INVENTION

The present invention aims to overcome the deficiencies of the prior art and provides a method and apparatus for automatically adjusting the hold-off time of a DSO to make the complex signals, such as FM, AM, PM and so on, be triggered correctly and displayed stably, and moreover, reduce the complexity and time consumption of the hold-off adjustment.

To achieve these objectives, in accordance with the present invention, a method for automatically adjusting the hold-off time of a DSO is provided, comprising:

(1) generating a synchronizing trigger signal according to the characteristics of the test signal, and setting the hold-off time to zero or the minimum value to which the hold-off time can be set;

(2) measuring a system trigger signal in real time to obtain a cycle sequence $C_1, C_2, \ldots, C_n$, wherein the system trigger signal is obtained by holding off the synchronizing trigger signal according to the hold-off time;

(3) detecting the cycle sequence $C_1, C_2, \ldots, C_n$ to obtain a maximum cycle and a minimum cycle, where the maximum cycle is denoted by $C_{max}$, the minimum cycle is denoted by $C_{min}$;

(4) judging the difference $C_{max}-C_{min}$: if the difference $C_{max}-C_{min}$ is greater than a threshold set by user, setting the hold-off time to the maximum cycle $C_{max}$, the minimum cycle $C_{min}$ or the median cycle $(C_{max}+C_{min})/2$, and then returning to step (2); otherwise, the difference $C_{max}-C_m$ is not greater than a threshold set by user, terminating the adjustment of the hold-off time. At this point, the hold-off time is correctly set.

As a further improvement thereof, setting an upper limit to the number of iterations, i.e. the number of returning to step (2), when the upper limit is reached, terminating the adjustment of the hold-off time. At this point, the difference $C_{max}-C_{min}$ is still greater than a threshold set by user, that means the test signal is not a quasi-periodic signal, the stable waveform display can't be obtained.

In accordance with the present invention, an apparatus for automatically adjusting the hold-off time of a DSO is further provided, comprising:

a trigger module for generating a synchronizing trigger signal according to the characteristics of the test signal;

a hold-off module for obtaining a system trigger signal by holding off the synchronizing trigger signal according to the hold-off time, where the system trigger signal is outputted to the acquisition module to control the acquisition of the test signal;

wherein further comprising:

a cycle measurement and judgment module for measuring the system trigger signal in real time to obtain a cycle sequence $C_1, C_2, \ldots, C_n$, detecting the cycle sequence $C_1, C_2, \ldots, C_n$ to obtain a maximum cycle and a minimum cycle, where the maximum cycle is denoted by $C_{max}$, the minimum cycle is denoted by $C_{min}$, and judging the difference $C_{max}-C_{min}$: if the difference $C_{max}-C_{min}$ is greater than a threshold set by user, setting the hold-off time to the maximum cycle $C_{max}$, minimum cycle $C_{min}$ or the median cycle $(C_{max}+C_{min})/2$, and then continuing to measure, detect, and judge, until the difference $C_{max}-C_m$ is not greater than a threshold set by user or the number of iterations reaches the upper limit.

The objectives of the present invention are realized as follows:

The present invention proposes a method and apparatus for automatically adjusting the hold-off time of a DSO based on real-time cycle measurements of the system trigger signal: first obtaining a cycle sequence by measuring the system trigger signal, and detecting the maximum cycle $C_{max}$ and minimum cycle $C_{min}$, then judging the difference $C_{max}-C_{min}$: if the difference $C_{max}-C_{min}$ is greater than a threshold set by user, setting the hold-off time to the maximum cycle $C_{max}$, minimum cycle $C_{min}$ or the median cycle $(C_{max}+C_{min})/2$, and then returning to step (2); otherwise, the difference $C_{max}-C_{min}$ is not greater than a threshold set by user, terminating the adjustment of the hold-off time. At this point, the hold-off time is correctly set. The present invention automatically adjusts the hold-off time of a DSO according to the difference $C_{max}-C_{min}$, which reduces the complexity and time consumption of the hold-off adjustment, and allows the test signal to be quickly and stably displayed on screen of DSO, meanwhile, which makes the trigger adjustment of DSO more convenient.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Figure 1:
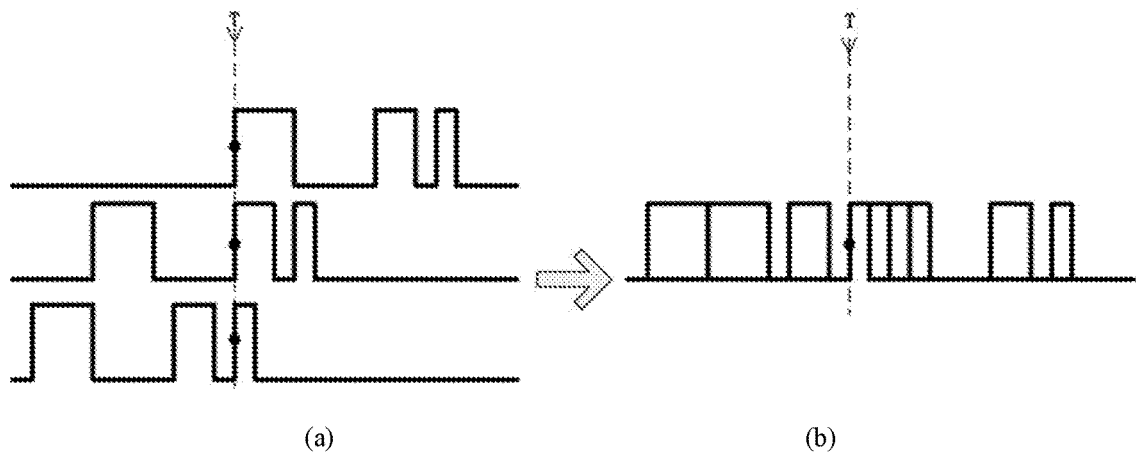
FIG. 1 is a waveform diagram showing unstable waveform display of a complex signal.

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

Figure 2:
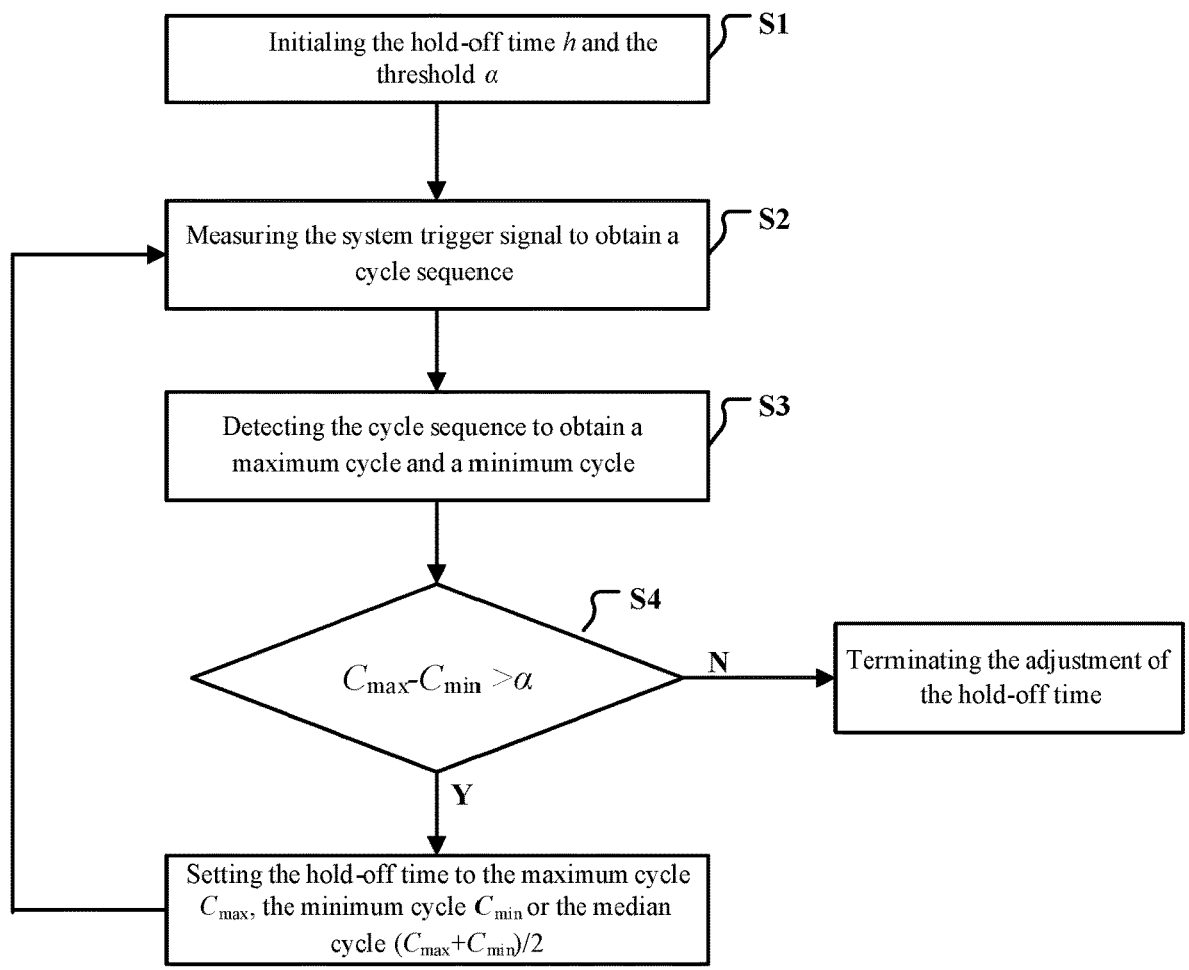
FIG. 2 is a flowchart of a method for automatically adjusting the hold-off time of a DSO according to one embodiment of the present invention.

FIG. 2 is a flowchart of a method for automatically adjusting the hold-off time of a DSO according to one embodiment of the present invention In one embodiment, as shown in FIG. 2, the present invention of a method for automatically adjusting the hold-off time of a DSO comprises:

Step S1: Initialing the hold-off time h and the threshold a

In the embodiment, the user sets the trigger mode of a DSO to a conventional mode, for example, edge trigger or pulse width trigger, and adjusts the trigger level of the DSO to generate a synchronizing trigger signal according to the characteristics of the test signal. In the embodiment, the characteristic is rising edge. The hold-off time h is set to zero or the minimum value to which the hold-off time can be set. The initial setting of the hold-off time is for obtaining the time interval of each trigger, i.e. the cycle.

In the embodiment, the user sets the threshold a, which represents the variation of cycles, to a certain value within [1, 10] sampling clocks. The small threshold a is, the slower the adjusting speed is, however, the better the hold-off time can be obtained.

Step S2: Measuring the system trigger signal to obtain a cycle sequence

The system trigger signal is obtained by holding off the synchronizing trigger signal according to the hold-off time. Then the cycle sequence $C_1, C_2, \ldots, C_n$, is obtained by measuring the system trigger signal in real time. Where n is the length of the cycle sequence. The length of n is set according to specific demand, the longer it is, the more time the adjustment will be taken. However, a shorter length of n will lead to an incomplete cycle sequence, which can't cover a base period of the test signal. In the embodiment, the maximum of n is 10000.

Step S3: Detecting the cycle sequence to obtain a maximum cycle and a minimum cycle A maximum cycle and a minimum cycle are obtained by detecting the cycle sequence $C_1, C_2, \ldots, C_n$. Here, the maximum cycle is denoted by $C_{max}$, the minimum cycle is denoted by $C_{min}$.

Step S4: Judging the difference $C_{max}-C_{min}$

Step S41: If the difference $C_{max}-C_{min}$ is greater than a threshold a set by user, setting the hold-off time to the maximum cycle $C_{max}$, the minimum cycle $C_{min}$ or the median cycle $(C_{max}+C_{min})/2$, and then returning to Step S2.

If the hold-off time is set to the maximum cycle $C_{max}$, the adjusting speed is the fastest, but the optimum hold-off time can't be obtained. If the hold-off time is set to the minimum cycle $C_{min}$, the adjusting speed is the slowest, but the optimum hold-off time can be obtained. Then if the hold-off time is set to the median cycle $(C_{max}+C_{min})/2$, the adjusting speed is moderate, and the hold-off time obtained is also moderate.

Step S42: Otherwise, the difference $C_{max}-C_{min}$ is not greater than a threshold a set by user, terminating the adjustment of the hold-off time. At this point, the hold-off time is correctly set, the system trigger signal is stable, which brings a stable waveform display.

As a further improvement thereof, an upper limit is set to the number of iterations, i.e. the number of returning to step S2. When the upper limit is reached, the adjustment of the hold-off time will be terminated. At this point, the difference $C_{max}-C_{min}$ is still greater than a threshold set by user, that means the test signal is not a quasi-periodic signal, the stable waveform display can't be obtained.

In the embodiment, if the number of iterations reaches the upper limit of 25, the adjustment of the hold-off time will be terminated.

Figure 3:
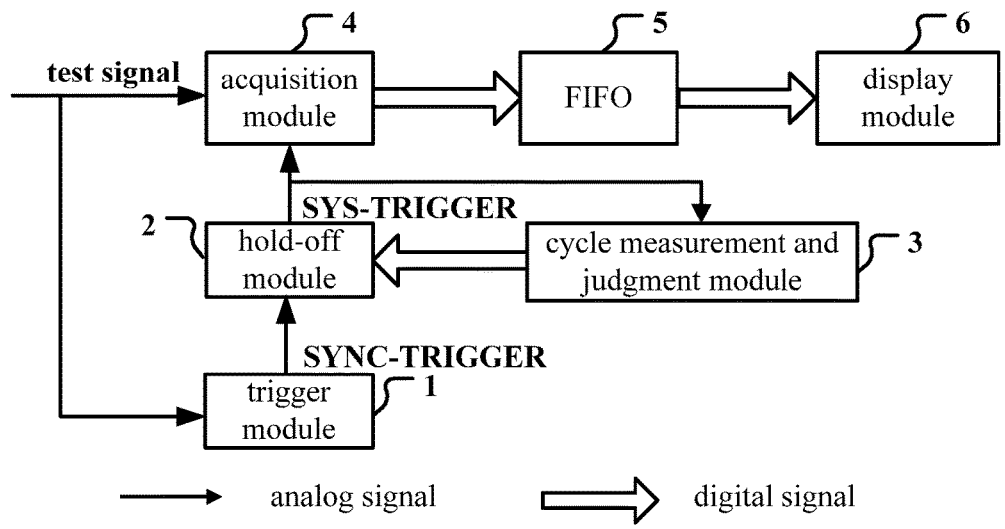
FIG. 3 is a block diagram of a DSO having an apparatus of automatically adjusting the hold-off time according to one embodiment of the present invention.

FIG. 3 is a block diagram of a DSO having an apparatus of automatically adjusting the hold-off time according to one embodiment of the present invention.

In one embodiment, as shown in FIG. 3, the present invention of an apparatus for automatically adjusting the hold-off time of a DSO comprises: a trigger module 1, a hold-off module 2 and a cycle measurement and judgment module 3.

The trigger module 1 receives a test signal, and generates a synchronizing trigger signal SYNC-TRIGGER according to the characteristics of the test signal. In the embodiment, the characteristic is rising edge. The user sets the trigger mode of a DSO to rising edge trigger, and adjusts the trigger level of the DSO. Thus, the trigger module 1 generates a synchronizing trigger signal SYNC-TRIGGER which has a trigger pulse corresponding to each rising edge of the test signal. The trigger module 1 is a prior art, the synchronizing trigger signal SYNC-TRIGGER is outputted to the hold-off module 2.

The hold-off module 2 receives the synchronizing trigger signal SYNC-TRIGGER, and holds off it to obtain a system trigger signal SYS-TRIGGER according to the hold-off time. The system trigger signal SYS-TRIGGER is outputted to the acquisition module 4 to control the acquisition of the test signal. The test signal is acquired by acquisition module 4, the acquired data is outputted to a FIFO 5. The FIFO 5 buffers the sample value, then outputs them to display module 6. Meanwhile, The system trigger signal SYS-TRIGGER is also outputted to the cycle measurement and judgment module 3.

As shown in FIG. 3, the cycle measurement and judgment module 3 is added to the trigger system to implement the automatically adjusting the hold-off time of a DSO. Firstly, the cycle measurement and judgment module 3 sets the hold-off time of the hold-off module 2 to zero or the minimum value, and then receives and measures the system trigger signal SYS-TRIGGER in real time to obtain a cycle sequence $C_1, C_2, \ldots, C_n$.

After obtaining cycle sequence $C_1, C_2, \ldots, C_n$, the cycle measurement and judgment module 3 detects the cycle sequence $C_1, C_2, \ldots, C_n$ to obtain a maximum cycle and a minimum cycle, where the maximum cycle is denoted by $C_{max}$, the minimum cycle is denoted by $C_{min}$, and then judges the difference $C_{max}-C_{min}$: if the difference $C_{max}-C_{min}$ is greater than a threshold set by user, the cycle measurement and judgment module 3 sets the hold-off time to the maximum cycle $C_{max}$, minimum cycle $C_{min}$ or the median cycle $(C_{max}+C_{min})/2$, and then continuing to measure, detect, and judge, until the difference $C_{max}-C_{min}$ is not greater than a threshold set by user. At this point, the hold-off time is correctly set.

Figure 4:
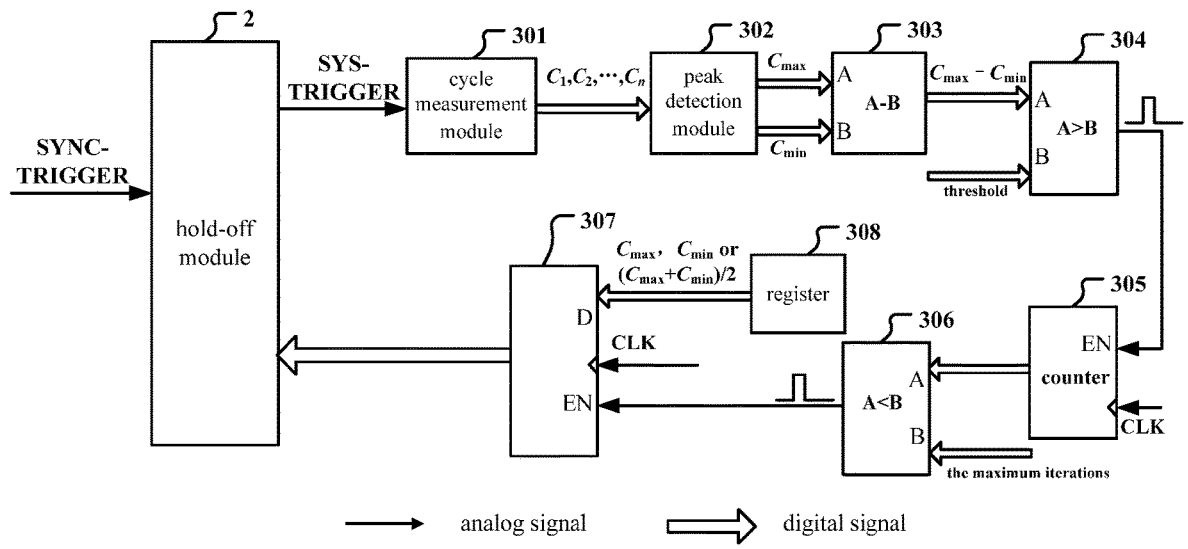
FIG. 4 is a block diagram of the cycle measurement and judgment module shown in FIG. 3 according to one embodiment of the present invention.

FIG. 4 is a block diagram of the cycle measurement and judgment module shown in FIG. 3 according to one embodiment of the present invention.

In one embodiment, as shown in FIG. 4, the cycle measurement and judgment module 3 shown in FIG. 3 further comprises: a cycle measurement module 301, a peak detection module 302, a subtractor 303, a first comparator 304, a counter 305, a second comparator 306, a latch 307 and a register 308.

The cycle measurement module 301 receives and measures the system trigger signal SYS-TRIGGER in real time to obtain a cycle sequence $C_1, C_2, \ldots, C_n$, then outputs the cycle sequence $C_1, C_2, \ldots, C_n$ to the peak detection module 302 to obtain a maximum cycle $C_{max}$ and a minimum cycle $C_{min}$. The maximum cycle $C_{max}$ and minimum cycle $C_{min}$ are outputted to the subtractor 303. The subtractor 303 calculates the difference $C_{max}-C_{min}$. The difference $C_{max}-C_{min}$ is outputted to the first comparator 304. The first comparator 304 compares the difference $C_{max}-C_m$, with a threshold set by user: if the difference $C_{max}-C_{min}$ is greater than the threshold, The first comparator 304 outputs a pulse to a counter 305. The counter 305 counts the pulses, the count value of the counter 305 is outputted to the second comparator 306. The second comparator 306 compares the count value with the maximum iterations: if the count value does not reach the upper limit, the comparator 306 outputs a enable pulse to the latch 307, the maximum cycle $C_{max}$, the minimum cycle $C_{min}$ or the median cycle $(C_{max}+C_{min})/2$ will be loaded from register 308 into the latch 307, the register 308 sets the hold-off time of the hold-off module 2 to the value it loaded.

In the embodiment, as shown in FIG. 4, The hold-off time of a DSO is adjusted according to the difference $C_{max}-C_{min}$, until the difference $C_{max}-C_{min}$, is not greater than a threshold set by user. At this point, the hold-off time is correctly set. Thus the present invention reduces the complexity and time consuming of the hold-off adjustment, and make the test signal quickly and stably displayed on screen of DSO. Meanwhile, it make the trigger adjustment of DSO more convenient.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A method for automatically adjusting a hold-off time of a Digital Storage Oscilloscope (DSO), the method comprising:
   (1) generating a synchronizing trigger signal according to characteristics of a test signal, and setting the hold-off time to zero or a minimum value to which the hold-off time is set;
   (2) measuring a system trigger signal in real time to obtain a cycle sequence $C_1, C_2, \ldots, C_n$, where n is an integer, the system trigger signal being obtained by holding off the synchronizing trigger signal according to the hold-off time;
   (3) detecting the cycle sequence $C_1, C_2, \ldots, C_n$ to obtain a maximum cycle and a minimum cycle, where the maximum cycle is denoted by $C_{max}$, and the minimum cycle is denoted by $C_{min}$; and
   (4) judging a difference $C_{max}-C_{min}$: when the difference $C_{max}-C_{min}$ is greater than a threshold set by user, setting the hold-off time to the maximum cycle $C_{max}$, the minimum cycle $C_{min}$ or a median cycle $(C_{max}+$ $C_{min})/2$, and then returning to step (2), and when the difference $C_{max}-C_{min}$ is not greater than the threshold set by the user, terminating an adjustment of the hold-off time indicating the hold-off time is correctly set.

2. The method for automatically adjusting the hold-off time of the DSO as recited in claim 1, further comprising setting an upper limit to a number of iterations by repeating steps (2) through step (4), and when the upper limit is reached, terminating the adjustment of the hold-off time.

3. An apparatus for automatically adjusting a hold-off time of a Digital Storage Oscilloscope (DSO), the apparatus comprising:

a trigger module configured to generate a synchronizing trigger signal according to characteristics of a test signal;

a hold-off module configured to obtain a system trigger signal by holding off the synchronizing trigger signal according to the hold-off time, the system trigger signal being outputted to an acquisition module to control acquisition of the test signal; and a cycle measurement and judgment module configured to measure the system trigger signal in real time to obtain a cycle sequence $C_1, C_2, \ldots, C_n$, where n is an integer, derive a maximum cycle and a minimum cycle, where the maximum cycle is denoted by $C_{max}$, the minimum cycle is denoted by $C_{min}$, and judge difference $C_{max}-C_{min}$: wherein when a difference $C_{max}-C_{min}$ is greater than a threshold set by user, setting the hold-off time to the maximum cycle $C_{max}$, minimum cycle $C_{min}$ or a median cycle $(C_{max}+C_{min})/2$, and then continuing to measure, derive, and judge, until the difference $C_{max}-C_{min}$ is not greater than the threshold set by user or a number of iterations reaches an upper limit.

* * * * *